(12) United States Patent
Sun et al.

(10) Patent No.: US 6,574,079 B2
(45) Date of Patent: Jun. 3, 2003

(54) MAGNETIC TUNNEL JUNCTION DEVICE AND METHOD INCLUDING A TUNNELING BARRIER LAYER FORMED BY OXIDATIONS OF METALLIC ALLOYS

(75) Inventors: Jijun Sun, Saku (JP); Satoru Araki, Saku (JP)

(73) Assignee: TDK Corporation, Tokyo (JP)

( * ) Notice: Subject to any disclaimer, the term of this patent is extended or adjusted under 35 U.S.C. 154(b) by 101 days.

(21) Appl. No.: 09/903,696

(22) Filed: Jul. 13, 2001

(65) Prior Publication Data

US 2002/0054462 A1 May 9, 2002

Related U.S. Application Data

(60) Provisional application No. 60/246,753, filed on Nov. 9, 2000.

(51) Int. Cl.[7] .............................. G11B 5/39; G11C 11/15
(52) U.S. Cl. .................... 360/324.2; 365/158; 365/173; 428/900
(58) Field of Search ........................ 360/324.2; 365/66, 365/97, 158, 171, 173; 428/692, 900; 328/32 R; 324/252; 427/127, 128, 129, 130; 257/421, 422

(56) References Cited

U.S. PATENT DOCUMENTS

| | | | |
|---|---|---|---|
| 5,159,513 A | 10/1992 | Dieny et al. | 360/324.1 |
| 5,729,410 A | 3/1998 | Fontana, Jr. et al. | 360/324.2 |
| 6,219,274 B1 * | 4/2001 | Shimazawa et al. | 365/158 |
| 6,347,049 B1 * | 2/2002 | Childress et al. | 365/173 |
| 6,359,289 B1 * | 3/2002 | Parkin | 257/43 |
| 6,361,863 B1 * | 3/2002 | Gambino et al. | 428/402 |
| 6,452,892 B1 * | 9/2002 | Kumagai et al. | 369/126 |
| 6,490,139 B1 * | 12/2002 | Hayashi et al. | 360/322 |

OTHER PUBLICATIONS

Moodera et al., "Large Magnetoresistance at Room Temperature in Ferromagnetic Thin Film Tunnel Junctions", Physical Review Letters, vol. 74, No. 16, pp. 3273–3276 (Apr. 17, 1995).

Parkin et al., "Exchange–biased magnetic tunnel junctions and application to nonvolatile magnetic random access memory", J. Appl. Phys., vol. 85, pp. 5828–5833 (Apr. 15, 1999).

Julliere, "Tunneling Between Ferromagnetic Films", Physics Letters, vol. 54A, No. 3, pp. 225–226 (Sep. 8, 1975).

Maekawa et al., "Electron Tunneling Between Ferromagnetic Films", IEEE Transactions on Magnetics, MAG–18, No. 2, pp. 707–708 (Mar. 1982).

Tsuge et al., "Magnetic tunnel junctions with in situ naturally–oxidized tunnel barrier", Appl. Phys. Lett. 71 (22), pp. 3296–3298 (Dec. 1, 1997).

U.S. patent application No. 09/621,003 filed on Jul. 20, 2000, entitled, "Magnetic Tunnel Junction Read Head Using a Hybrid, Low–Magnetization Flux Guide" to Olivier Redon et al.

* cited by examiner

*Primary Examiner*—David L. Ometz
(74) *Attorney, Agent, or Firm*—Morgan, Lewis & Bockius LLP

(57) ABSTRACT

A magnetic tunnel junction is made up of two ferromagnetic layers, one of which has its magnetic moment fixed and the other of which has its magnetic moment free to rotate, an insulating tunneling barrier layer between the ferromagnetic layers for permitting tunneling current perpendicularly through the layers. The insulating barrier is preferably formed by the oxidation of a thin metallic alloy layer of particular materials which lead to a nonmagnetic barrier having a relatively low barrier height. These low barrier height insulating materials allow for the formation of a magnetic tunnel junction with a relatively thick barrier while maintaining a low resistance that is suitable, for example, in magnetoresistance read head applications.

33 Claims, 7 Drawing Sheets

MAGNETIC TUNNEL JUNCTION DEVICE AND METHOD INCLUDING A TUNNELING BARRIER LAYER FORMED BY OXIDATIONS OF METALLIC ALLOYS

This application claims the benefit of a provisional application, which was filed on Nov. 9, 2000 and assigned Provisional Application Number 60/246,753, which is hereby incorporated by reference.

BACKGROUND OF THE INVENTION

1. Field of Invention

The present invention relates generally to the art of magnetic tunnel junction (MTJ) read head devices, which sense magnetic fields in a magnetic recording medium. More particularly, the present invention relates to a magnetic tunnel junction arrangement having a tunneling barrier made of particular materials that result in high tunneling performance. The invention finds particular application in conjunction with reading hard disk drives and will be described with particular reference thereto. However, it is to be appreciated that the invention will find application with other magnetic storage media. Further, it is to be appreciated that the invention will find application in other magnetic field detection devices as well as in other devices and environments.

2. Description of the Related Art

Magneto-resistive (MR) sensors based on anisotropic magneto-resistance (AMR) or a spin-valve (SV) effect are widely known and extensively used as read transducers to read magnetic recording media. Such MR sensors can probe the magnetic stray field coming out of transitions recorded on a recording medium by generating resistance changes in a reading portion formed of magnetic materials. AMR sensors have a low resistance change ratio or magneto-resistive ratio $\Delta R/R$, typically from 1 to 3%, whereas SV sensors have a $\Delta R/R$ ranging from 2 to 7% for the same magnetic field excursion. SV heads showing such high sensitivity are able to achieve very high recording densities, that is, over several giga bits per square inch or Gbits/in$^2$. Consequently, SV magnetic read heads are progressively supplanting AMR read heads.

In a basic SV sensor, two ferromagnetic layers are separated by a non-magnetic layer, an example of which is described in U.S. Pat. No. 5,159,513. An exchange or pinning layer of FeMn, for example, is further provided adjacent to one of the ferromagnetic layers. The exchange layer and the adjacent ferromagnetic layer are exchange-coupled so that the magnetization of the ferromagnetic layer is strongly pinned or fixed in one direction. The magnetization of the other ferromagnetic layer is free to rotate in response to a small external magnetic field. When the magnetizations of the ferromagnetic layers are changed from a parallel to an anti-parallel configuration, the sensor resistance increases yielding a relatively high MR ratio.

Recently, new MR sensors using tunneling magneto-resistance (TMR) have shown great promise for their application to ultra-high density recordings. These sensors, which are known as magnetic tunnel junction (MTJ) sensors or magneto-resistive tunnel junctions (MRTJ), came to the fore when large TMR was first observed at room temperature. See Moodera et al, "Large magneto resistance at room temperature in ferromagnetic thin film tunnel junctions," Phys. Rev. Lett. v. 74, pp. 3273–3276 (1995). Like SV sensors, MTJ sensors basically consist of two ferromagnetic layers separated by a non-magnetic layer. One of the magnetic layers has its magnetic moment fixed along one direction, i.e., the fixed or pinned layer, while the other layer, i.e., free or sensing layer, is free to rotate in an external magnetic field. However, unlike SV sensors, this non-magnetic layer between the two ferromagnetic layers in MTJ sensors is a thin insulating barrier or tunnel barrier layer. The insulating layer is thin enough so that electrons can tunnel through the insulating layer. Further, unlike SV sensors, MTJ sensors operate in CPP (Current Perpendicular to the Plane) geometry, which means its sensing current flows in a thickness direction of a laminate film or orthogonal to the surfaces of the ferromagnetic layers.

The sense current flowing through the tunnel barrier layer is strongly dependent upon a spin-polarization state of the two ferromagnetic layers. When the sense current experiences the first ferromagnetic layer, the electrons are spin polarized. If the magnetizations of the two ferromagnetic layers are anti-parallel to each other, the probability of the electrons tunneling through the tunnel barrier is lowered, so that a high junction resistance $R_{ap}$ is obtained. On the other hand, if the magnetizations of the two ferromagnetic layers are parallel to each other, the probability of the electrons tunneling is increased and a high tunnel current and low junction resistance $R_p$ is obtained. In an intermediate state between the parallel and anti-parallel states, such as when the both ferromagnetic layers are perpendicular in magnetization to each other, a junction resistance $R_m$ between $R_{ap}$ and $R_p$ is obtained such that $R_{ap} > R_m > R_p$. Using these symbols, the TMR ratio may be defined as $\Delta R/R = (R_{ap} - R_p)/R_p$.

The relative magnetic direction orientation or angle of the two magnetic layers is affected by an external magnetic field such as the transitions in a magnetic recording medium. This affects the MTJ resistance and thus the voltage of the sensing current or output voltage. By detecting the change in resistance and thus voltage based on the change in relative magnetization angle, changes in an external magnetic field are detected. In this manner, MTJ sensors are able to read magnetic recording media.

Another problem is a trade-off between high TMR ratio and MTJ resistance. The TMR ratio is proportional to the spin polarization of the two ferromagnetic layers. A TMR ratio as high as 40% was achieved by choosing a preferable composition for the two ferromagnetic layers. See Parkin et al., "Exchange-biased magnetic tunnel junctions and application to nonvolatile magnetic random access memory," J. Appl. Phys., v. 85, pp. 5828–5833 (Apr. 15, 1999). However, despite this large TMR ratio, the application of such MTJs in read heads was, up to now, prohibitory due to the large resistance of the junctions, resulting in a large shot noise $V_{rms}$ and a poor signal to noise ratio S/N. Shot noise $V_{rms} = (2 \cdot e \cdot I \cdot \Delta f)^{1/2} \times R$, where: $e = 1.6 \times 10^{-19} C$; I=current; $\Delta f$=bandwidth; and R=junction resistance.

It is possible to reduce the MTJ's resistance-area product R·A or RA using a natural, in situ oxidation method. RA is a characteristic of an insulating barrier and contributes to junction resistance R through the equation R=R·A/junction area. Using a 7 Å or less Al layer that is properly oxidized, an RA as low as 15 $\Omega \cdot \mu m^2$ has been achieved. This remarkably low value together with the high TMR ratio make MTJs very attractive for application as read heads for very high recording densities.

However, yet another problem in MTJs is that the thin insulating barrier is very sensitive to one of the manufacturing processes called lapping. Lapping involves the definition of an air bearing surface (ABS) on the MTJ head.

Because the insulating barrier is so thin, lapping can create electrical shorts between the two adjacent magnetic layers, rendering the sensor useless.

Tunneling magnetoresistance (TMR) was discussed by Julliere in "Tunneling Between Ferromagnetic Films" *Physics Letters,* 54A 225 (1975). However, prior to 1995, the reported MTJ junctions only show very small TMR response at room temperature, at best being on the order of 1–2%.

An MTJ device with a large TMR over 10% at room temperature was reported by Moodera et al. in the aforementioned article "Large Magnetoresistance at Room Temperature in Ferromagnetic Thin Film tunnel Junctions" *Physics Review Letters,* 74, 3273 (1995). It was hypothesized that increased TMR performance could be achieved by a decrease in surface roughness that results from the base electrode growth, by evaporation onto a cryogenically-cooled substrate, by the use of a seed layer, and by keeping the base electrode extremely thin. The tunnel barrier was formed by cryogenically depositing an Al layer and subsequently warming this layer and plasma oxidizing it to consume more of the Al. The resulting junction resistances were in the range of hundreds of Ohms to tens of k$\Omega$ for junctions with cross-sectional areas of 200×300 $\mu m^2$.

The relatively large junction resistance of some MTJ device arrangements severely limits their use in particular applications, such as read head applications for example, due to the low signal to noise ratio (S/N) that results from their relatively high junction resistance values. While some of these MTJ arrangements may have favorable TMR response values, their corresponding low signal to noise ratios diminish the advantage provided by their TMR values. The junction resistance factor becomes even more critical as the junction resistance is scaled up when junction size is decreased, as is required for high area density recording applications. Accordingly, a need remains for an MTJ device arrangement having a sufficiently large TMR response at room temperature, while still providing a reasonably low junction resistance.

Therefore, a goal of the present invention is to provide a MTJ read head design in which the resulting TMR ratio is maximized by choosing particular tunneling barrier materials for the MTJ. These particular tunneling barrier materials should provide a reasonably low junction resistance while still maintaining a high performance TMR response.

Another goal of the present invention is to provide a design wherein the tunneling barrier in MTJ has relatively large thickness while still maintaining a reasonably low junction resistance by choosing particular tunneling barrier materials with low barrier height.

SUMMARY OF THE INVENTION

Accordingly, the present invention is directed to a magnetic tunnel junction device that substantially obviates one or more of the problems due to limitations and disadvantages of the related art.

A magnetic tunnel junction (MTJ) is made up of two ferromagnetic layers, one of which has its magnetic moment fixed and the other of which has its magnetic moment free to rotate. Located between these two ferromagnetic layers is an insulating tunneling barrier layer for permitting tunneling current to flow perpendicularly through the layers. The insulating barrier is preferably formed by oxidation of a thin metallic alloy layer.

One advantage of the present invention is that it provides an MTJ having a nonmagnetic tunneling barrier with a relatively low barrier height. By forming the MTJ with insulating materials that result in a low barrier height, it is possible to fabricate the MTJ with a relatively thick insulating barrier while still maintaining low junction resistance, as desired for magnetoresistance read head applications.

Still further advantages of the present invention will become apparent to those of ordinary skill in the art upon reading and understanding the following detailed description of the preferred embodiments taken together with the accompanying figures.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

In the drawings.

DETAILED DESCRIPTION OF THE PREFERRED EMBODIMENTS

By way of overview, the present invention provides a magnetic tunnel junction device and method for use in the general technical field of the read head arrangement as described in detail in a copending U.S. patent application Ser. No. 09/621,003 filed on Jul. 20, 2000, entitled "MAGNETIC TUNNEL JUNCTION READ HEAD USING A HYBRID, LOW-MAGNETIZATION FLUX GUIDE" to Olivier Redon et al., now U.S. Pat. No. 6,519,124 along with its corresponding U.S. Provisional Application No. 60/192,320, filed on Mar. 27, 2000, which are herein expressly incorporated by reference.

Reference will now be made in detail to the preferred embodiments of the present invention, examples of which are illustrated in the accompanying drawings.

Figure 1A:
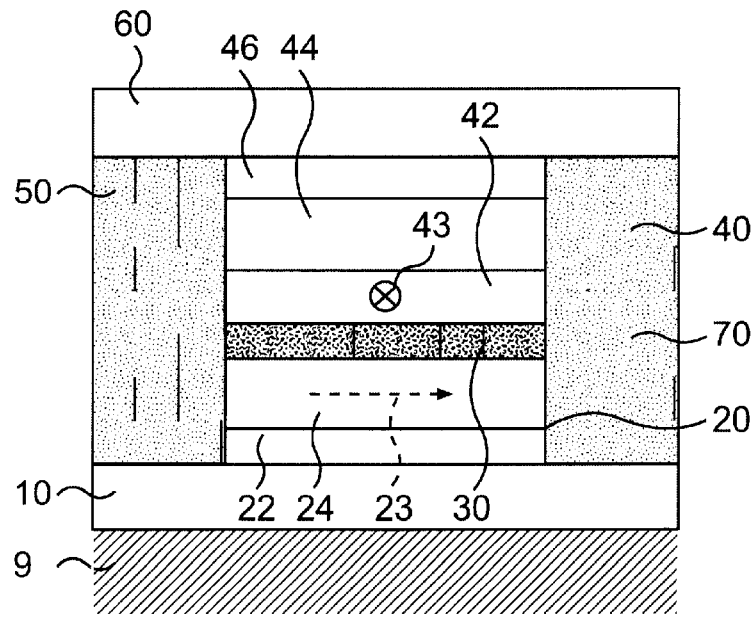
FIGS. 1A–1B illustrate a cross-sectional view and a top view, respectively, of a magnetic tunnel junction device having a fixed ferromagnetic layer on top of tunneling barrier.
Figure 1B:
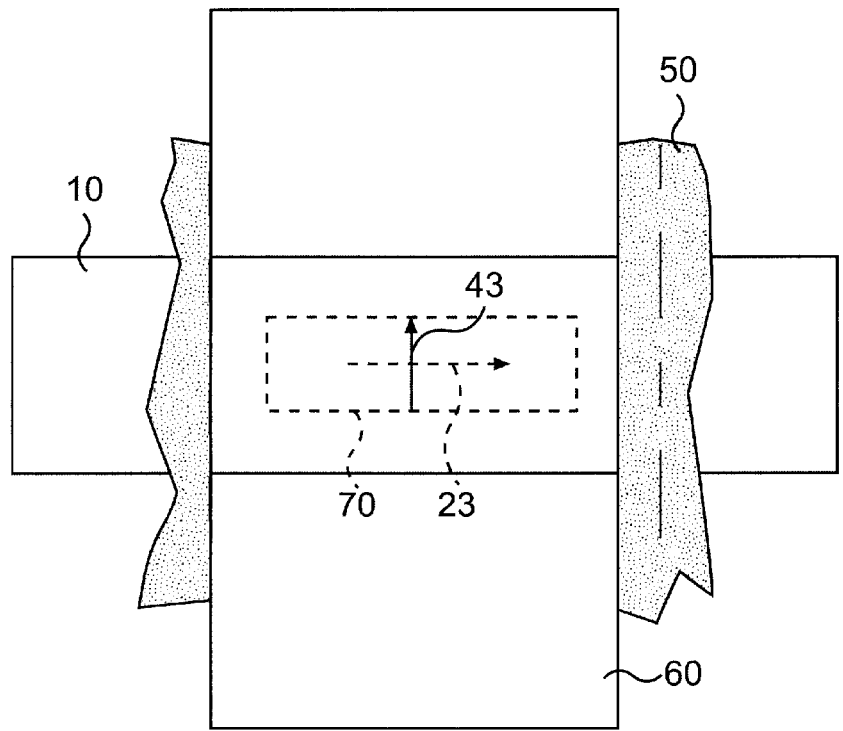

FIGS. 1A and 1B illustrate schematic views of an MTJ device arrangement that is suitable for use in magnetic field sensor applications. The MTJ device of FIG. 1A includes a base electrode stack 20, an insulating tunnel barrier 30, and a top electrode stack 40. The MTJ is formed on a substrate 9. A bottom electrical lead 10 is situated between the base electrode stack 20 and the substrate 9. The MTJ device is completed by the formation of an insulating layer 50.

A top-wiring layer 60 is provided in contact with a top surface of the MTJ. This wiring layer 60 serves as an electrical lead. Each of electrode stacks 20 and 40 includes a ferromagnetic layer located on opposite sides of, and each in contact with, the insulating tunneling barrier 30. The base electrode stack 20 formed on a top surface of bottom electrical lead 10 includes a seed layer 22 and a free ferromagnetic layer 24 that is formed on the seed layer 22, as shown in FIG. 1A. The seed layer 22 is a non-magnetic layer that is provided for increased magnetic performance within the MTJ arrangement. The seed layer is preferably formed of a material selected from a group that includes Ta, Cr, Ti, NiCr alloys, and NiFeCr alloys.

The top electrical stack 40 includes a fixed ferromagnetic layer 42 and a pinning antiferromagnetic layer 44, as well as and a protective layer 46 that is formed on antiferromagnetic layer 44. The ferromagnetic layer 42 is called the fixed layer because its magnetic moment is prevented from rotation in the presence of applied magnetic fields in the desired range of interest for MTJ device, while the magnetic moment of the free ferromagnetic layer 24 is not fixed, and is thus free to rotate in the presence of an applied magnetic field in the range of interest. The direction 43 of magnetization of fixed ferromagnetic layer is preferably aligned parallel to the external magnetic field. The magnetization direction 23 of the free layer 24 is preferably located perpendicular to the direction 43 of magnetization of the fixed ferromagnetic layer 42 when no external magnetic field is present.

A sense current I is directed from the electrically conductive materials making up the top lead 60 to protective layer 46. It is then directed perpendicularly through the antiferromagnetic layer 44, the fixed ferromagnetic layer 42, the tunneling barrier 30 and the free ferromagnetic layer 24. It is subsequently passed through to the seed layer 22 and out through bottom lead 10. The amount of tunneling current through the tunnel barrier 30 is a function of the relative orientations of the magnetizations of the fixed and free ferromagnetic layers 42 and 24, respectively, which are adjacent to and in contact with the tunnel barrier layer 30.

The magnetic field from the recorded media cause the magnetization direction of free ferromagnetic layer 23 to rotate away from the direction 23, for example, into or out of the paper of FIG. 1A. This results in a variation of the relative orientation of the magnetic moments of the ferromagnetic layers 42 and 24 and thus varies the amount of the tunneling current. This change is reflected as a variation in the electrical resistance of the MTJ 70. This resistance variation is detected by the disk drive electronics and processed into data read back from the disk, for example.

The occurrence of shot noise is another phenomenon that prevails in MTJ devices. Shot noise is proportional to the junction resistance and the square root of sensing current. In order to have a high enough signal to noise ratio (S/N), the junction resistance must be decreased. The junction resistance is exponentially proportional to the barrier thickness (d) and the square root of barrier height ($\Phi$) (R $\exp(d\Phi^{1/2})$). One of the main methods to lower junction resistance is to decrease the barrier thickness.

It has been determined that desirable tunneling barrier properties result from forming the tunneling barrier by oxidation of a metal layer. It has also been determined that a decrease in junction resistance results from a reduction in the thickness of this metal layer. Ni that has been oxidized (NiOx) has been tested as a potential insulator for use in a tunneling barrier in a magnetic tunnel junction. However, the junction resulting from this NiOx barrier composition resulted in a TMR lower than 2% as reported by S. Maekawa and U. Gafvert in "Electron Tunneling Between Ferromagnetic Films" in *IEEE Transactions on Magnetics*, MAG-18, 707–708 (1982). The low TMR resulting from this arrangement is due to spin flip scattering that occurs because the NiOx insulator is also an antiferromagnetic layer at room temperature. The use of NiOx as an insulator is advantageous because of NiOx's relatively low energy gap, which is also referred to as barrier height. This low barrier height of NiOx can also lead to a desirable small junction resistance. As a result, the use of an oxidized Ni-based alloy as a tunneling barrier material not only decreases the overall junction resistance of the MTJ, but also can reduce the undesirable spin flip scattering effect when the Ni-based alloy is non magnetic. These advantageous effects will only result, however, if the proper composition and elements are chosen for the alloy.

Figure 2A:
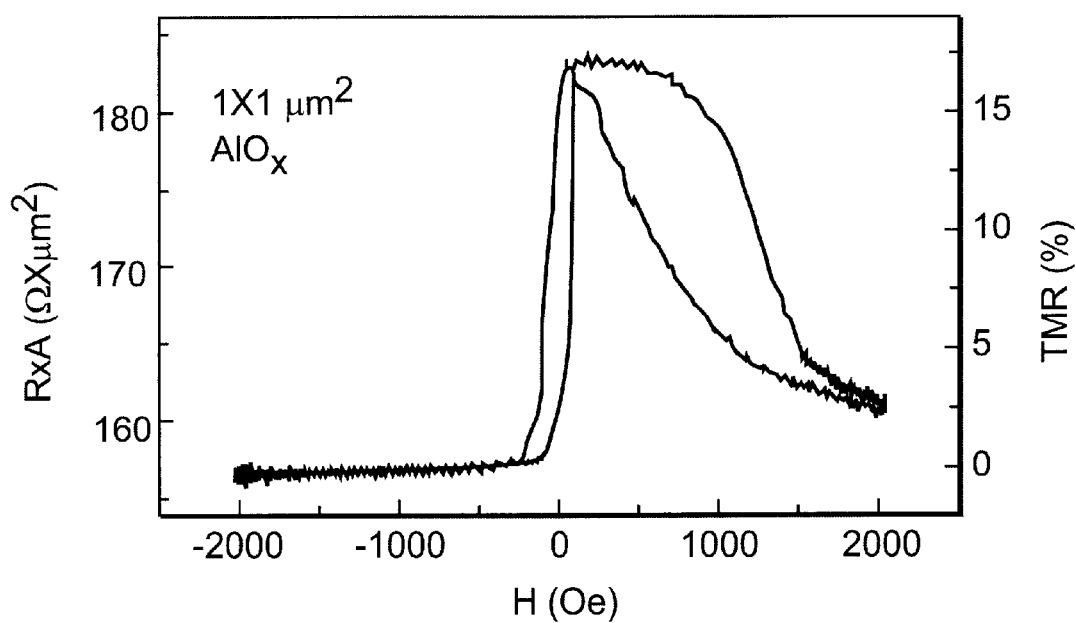
FIGS. 2A–2B illustrate graphical representations of junction resistance and tunneling magnetoresistance (TMR) versus applied magnetic field response of 1×1 $\mu m^2$ magnetic tunnel junctions having a tunneling barrier of AlOx and NiCrOx, respectively, according to preferred embodiments of the present invention. These exemplary tunneling barriers were formed by oxidation of a 9 Å thick Al or NiCr layer.
Figure 2B:
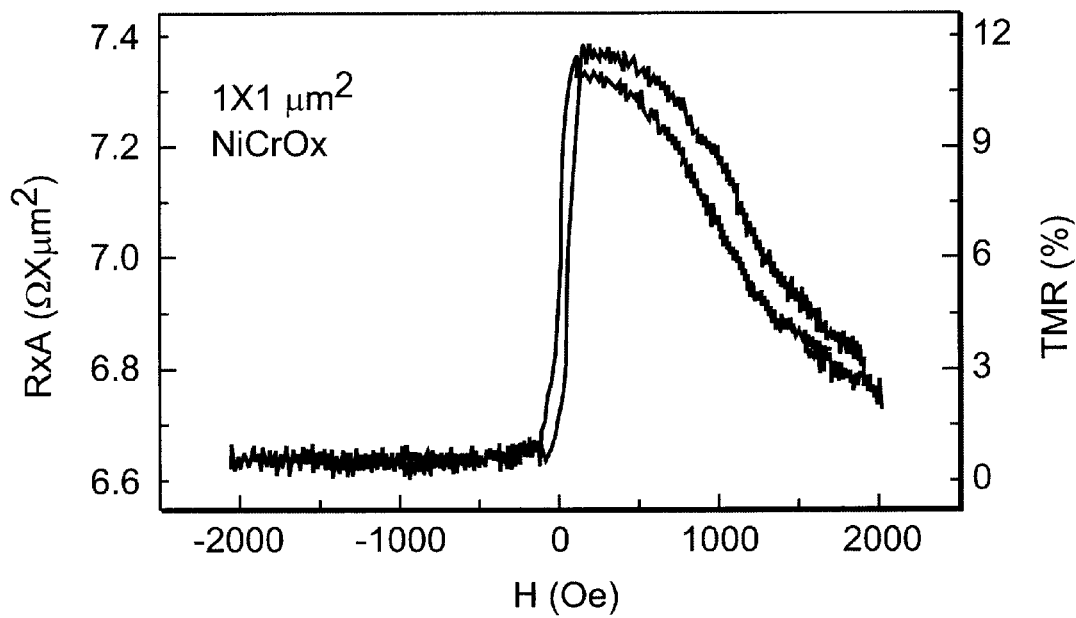

FIGS. 2A–2B illustrate graphical representations of junction resistance and tunneling magnetoresistance (TMR) versus applied magnetic field response of 1×1 $\mu m^2$ magnetic tunnel junctions having a tunneling barrier of AlOx and NiCrOx, respectively, according to preferred embodiments of the present invention. These exemplary tunneling barriers were formed by oxidation of a 9 Å thick Al or NiCr layer.

MTJ's in accordance with one preferred embodiment of the instant invention have a structure of Ta/NiFe/CoFe/Barrier/CoFe/Ru/CoFe/PtMn/Ta, using Ta/Cu/Ta as bottom and top leads. That is, Ta is a seed layer 22, NiFe/CoFe is a free layer 24, CoFe/Ru/CoFe is a fixed layer 42, PtMn is a pinning layer 44, and Ta is a protective layer 46. Ta/Cu/Ta is preferably used for bottom and top leads 10 and 60. The materials of the alloyed layer used to form the tunneling barrier 30 preferably comprise an alloy of Ni and one or more non-magnetic materials, such as Cr, Mo, Ta, Nb, Cu, Pt, Pd, B, C, Al, W, Si, Ti, V, Ru, Re, Zr, Hf, Mg, Ga, and their alloys.

The fixed ferromagnetic layer 42 of the magnetic tunnel junction device preferably comprises a sandwich structure including two ferromagnetic layers antiferromagnetically coupled through a non-magnetic metal layer selected from a group including Ru, Re, Rh, Cu, and Cr.

For junctions having an AlOx tunneling barrier, as shown in FIG. 2A, the junction has a resistance RA of about 150 $\Omega \mu m^2$ and TMR of about 18% at room temperature. As shown in FIG. 2B, with NiCrOx as the tunneling barrier, the junction resistance is much lower, having a value of about 6.6 $\Omega \mu m^2$. However, FIG. 2B also indicates that the TMR ratio for this arrangement is also a relatively small value. This low TMR ratio is likely due to the effect of spin flip scattering.

The Applicant has determined that optimized tunneling magnetoresistance (TMR) for magnetic tunnel junctions with NiCrOx as the tunneling barrier may be ensured if the following methodology is observed.

The quality of the thin NiCr layer should be optimized by forming it at the proper deposition condition and substrate temperature. The proper deposition condition includes the optimized Ar pressure and applied power during the NiCr deposition. The substrate is preferably cooled below room temperature (around 150K). Both of these steps will result in a reduction of the grain size of the NiCr layer and thus give rise to the better quality of the barrier and also will improve tunneling magnetoresistance. In NiCr alloys, there is a relatively large range of Cr content for which the alloy is non-magnetic.

The composition of the NiCrOx insulating barrier may be optimized by choosing the proper NiCr composition by selecting the target composition, thus giving rise to a higher tunneling magnetoresistance.

The oxidation condition should also be optimized. In reaching the results of a preferred embodiment of the instant invention, the NiCr layer was oxidized using the same oxidation process as for the formation of the Al alloy layer. For example, the thin metal layer (NiCr or Al) is exposed to a pure oxygen atmosphere at a pressure of 200 Torr for 1 hour at room temperature. This preferred oxidation method may be referred to as a natural oxidation method. There is preferably no vacuum break until the deposition of all of the layers of the magnetic tunnel junction is completed.

Another preferred way to optimize the oxidation condition includes choosing a different oxidation method, such as plasma oxidation or radical oxygen oxidation, for example, instead of natural oxidation method mentioned above. Choosing a proper oxidation pressure, for instance, from a few mTorr to a few hundred Torr, or applying a small amount of heat to the sample to accelerate the oxidation are also preferred methodologies to follow. Moreover, a preferred oxidation duration, for example, falls within a range of a few minutes to a few hours. These oxidation pressure and oxidation duration optimized parameters are also dependent on which particular oxidation method is used.

The selection of particular materials that make up the buffer layer and the ferromagnetic layer can give rise to an improved crystalline texture, which leads to a improved NiCr layer growth into a particular crystalline orientation. As a result, the tunneling magnetoresistance will be further improved.

Figure 3A:
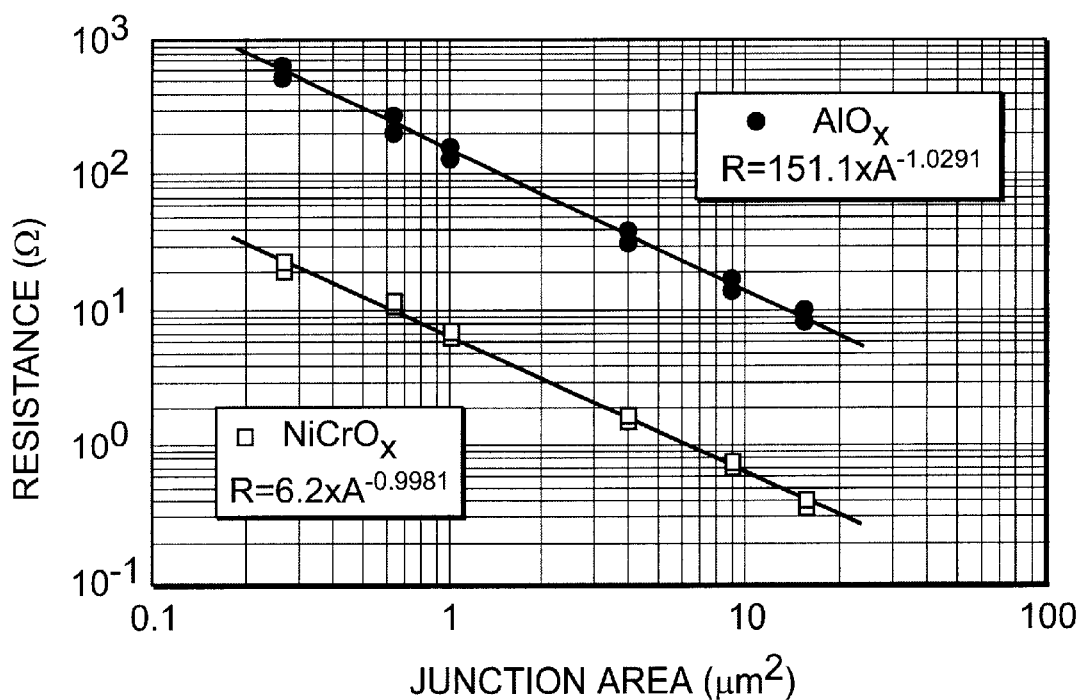
FIGS. 3A–3B illustrate graphical representations of junction resistance and tunneling magnetoresistance, respectively, as a function of junction area for magnetic tunnel junctions having a tunneling barrier of AlOx and NiCrOx according to preferred embodiments of the present invention. These exemplary tunneling barriers were formed by oxidation of a 9 Å thick Al or NiCr layer.
Figure 3B:
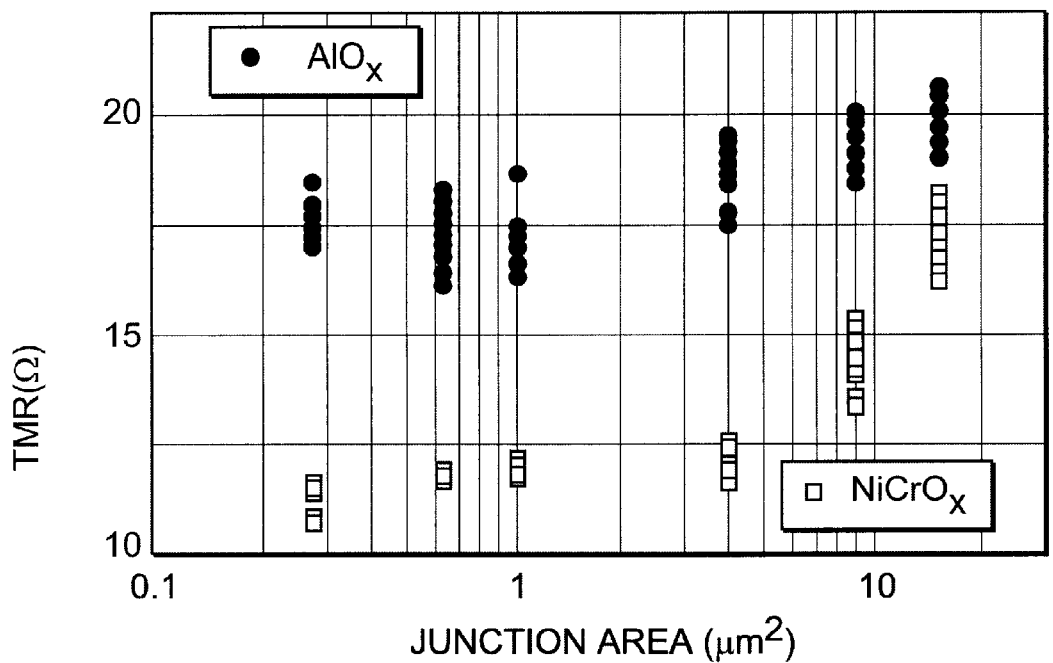

FIGS. 3A–3B illustrate graphical representations of junction resistance and tunneling magnetoresistance, respectively, as a function of junction area for magnetic tunnel junctions having a tunneling barrier of AlOx and NiCrOx according to preferred embodiments of the present invention. These exemplary tunneling barriers were formed by oxidation of a 9 Å thick Al or NiCr layer.

The junction resistance is well scaled with R 1/A, where A is junction area. As shown in FIG. 3B, for the NiCrOx barrier, the tunneling magnetoresistance TMR is about 11–12%, independent of junction area, when A is less than $1 \times 1$ $\mu m^2$. However, for the NiCrOx barrier having a junction area larger than $1 \times 1$ $\mu m^2$, an improved TMR results due to the geometrically-improved TMR effect that results because the junction resistance is either comparable or much less than the lead resistance (square resistance R≈0.45Ω).

Figure 4A:
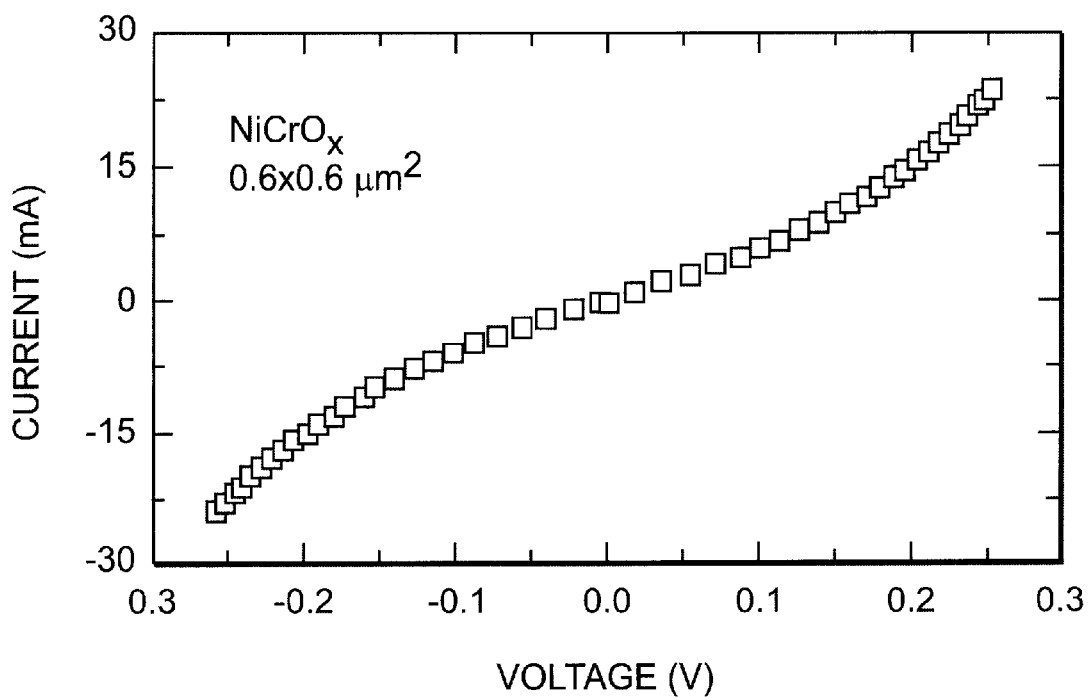
FIGS. 4A–4B illustrate graphical representations of current-voltage and conductance-voltage characteristics for a 0.6×0.6 $\mu m^2$ magnetic tunnel junction with a NiCrOx tunneling barrier, according to a preferred embodiment of the present invention. This exemplary tunneling barrier was formed by oxidation of a 9 Å thick NiCr layer.
Figure 4B:
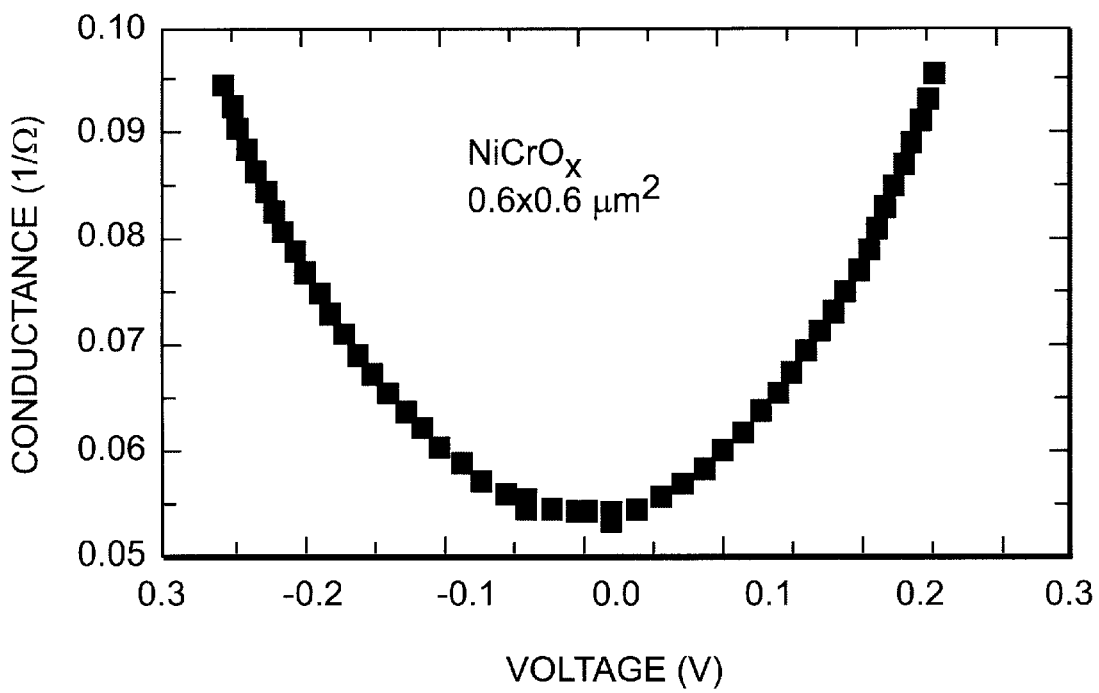

FIGS. 4A–4B illustrate graphical representations of current-voltage and conductance-voltage characteristics for a $0.6 \times 0.6$ $\mu m^2$ magnetic tunnel junction with an NiCrOx tunneling barrier, according to a preferred embodiment of the present invention. This exemplary tunneling barrier was formed by oxidation of a 9 Å thick NiCr layer. The I–V curve of FIG. 4A shows non-linear behavior. The conductance curve of FIG. 4B is dependent on the applied bias voltage. FIGS. 4A–4B indicate that the tunneling through the NiCrOx insulator is the major conductance process in these magnetic tunnel junctions.

Figure 5:
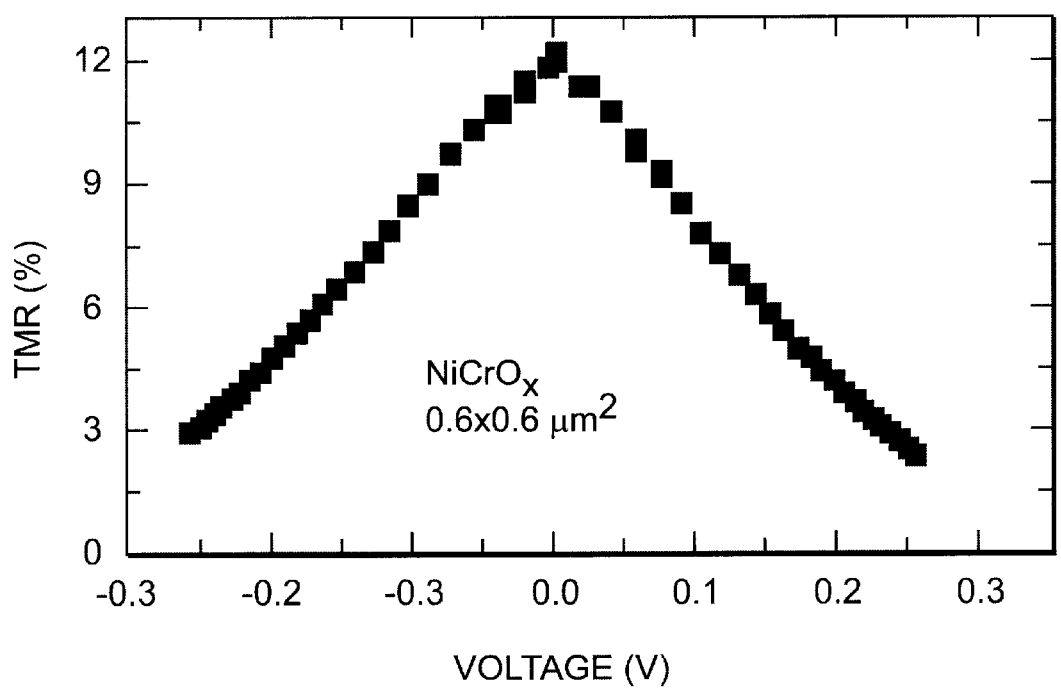
FIG. 5 illustrates a graphical representation of TMR versus bias voltage for a 0.6×0.6 $\mu m^2$ magnetic tunnel junction with a NiCrOx tunneling barrier, according to a preferred embodiment of the present invention. This exemplary tunneling barrier was formed by oxidation of a 9 Å thick NiCr layer.

FIG. 5 illustrates a graphical representation of TMR versus bias voltage for a $0.6 \times 0.6$ $\mu m^2$ magnetic tunnel junction with an NiCrOx tunneling barrier, according to a preferred embodiment of the present invention. This exemplary tunneling barrier was formed by oxidation of a 9 Å thick NiCr layer. As shown in FIG. 5, the TMR is significantly decreased at a rapid pace when bias voltage is increased, which is a phenomenon typically observed in such magnetic tunnel junction arrangements. For example, FIG. 5 shows a TMR decrease to half of its initial value at a bias of about –0.16V or 0.14V (the positive bias refers to the bias from top to bottom electrode). This rapid decrease in TMR with bias voltage fluctuations is a common feature found in magnetic tunnel junctions having a low barrier height.

Figure 6A:
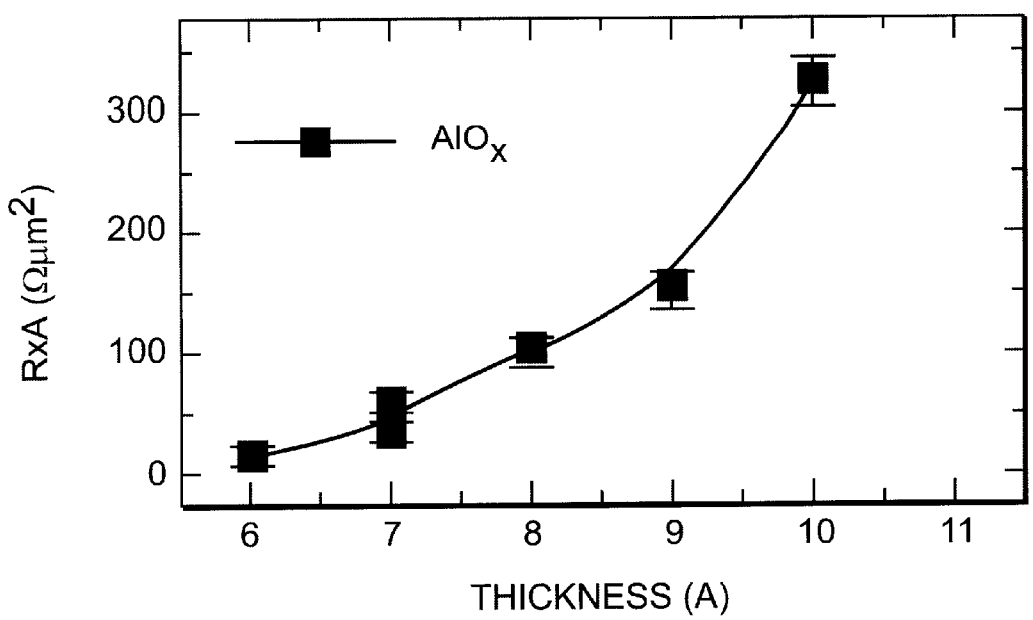
FIGS. 6A–6B illustrate graphical representations of junction resistance as a function of the thickness of the metallic layer formed of Al and NiCr, respectively, to form the tunnel barrier according to preferred embodiments of the present invention.
Figure 6B:
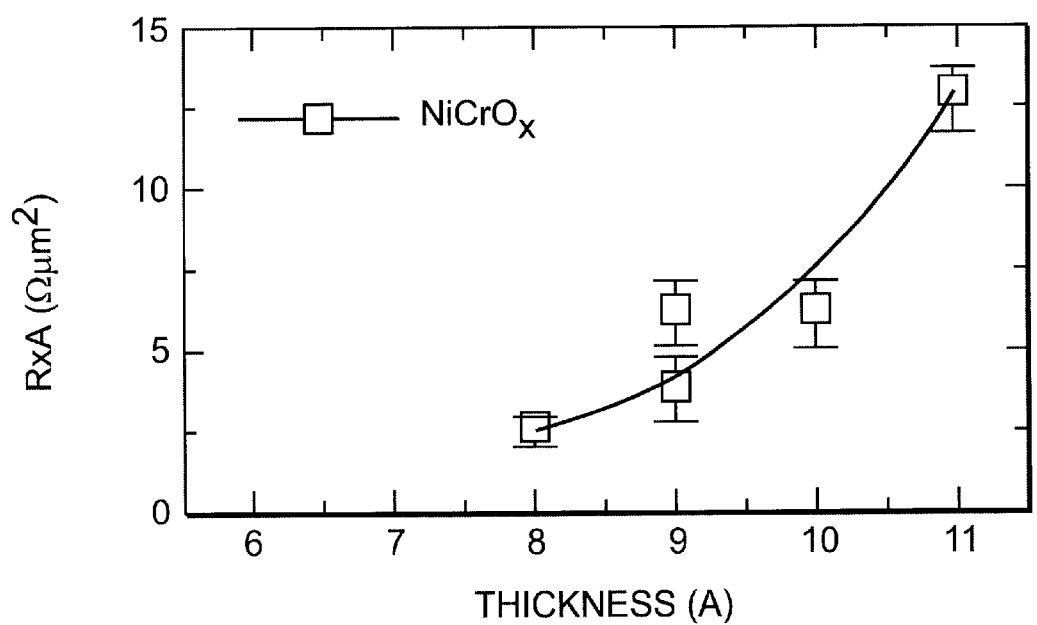

FIGS. 6A–6B illustrate graphical representations of junction resistance as a function of the thickness of the metallic layer formed of Al and NiCr, respectively, to form the tunnel barrier according to preferred embodiments of the present invention. FIGS. 6A and 6B show that the junction resistance increases with Al or NiCr thickness due to the increase of the tunneling barrier thickness. As shown in FIG. 6A, the junction resistance increases much more rapidly for the AlOx tunneling barrier, as compared to the NiCrOx tunneling barrier junction resistance increase shown in FIG. 6B, due to AlOx's larger barrier height. As illustrated in FIG. 6B, the metallic layer thickness for the NiCr embodiment is preferably less than or equal to 11 Å.

Figure 7A:
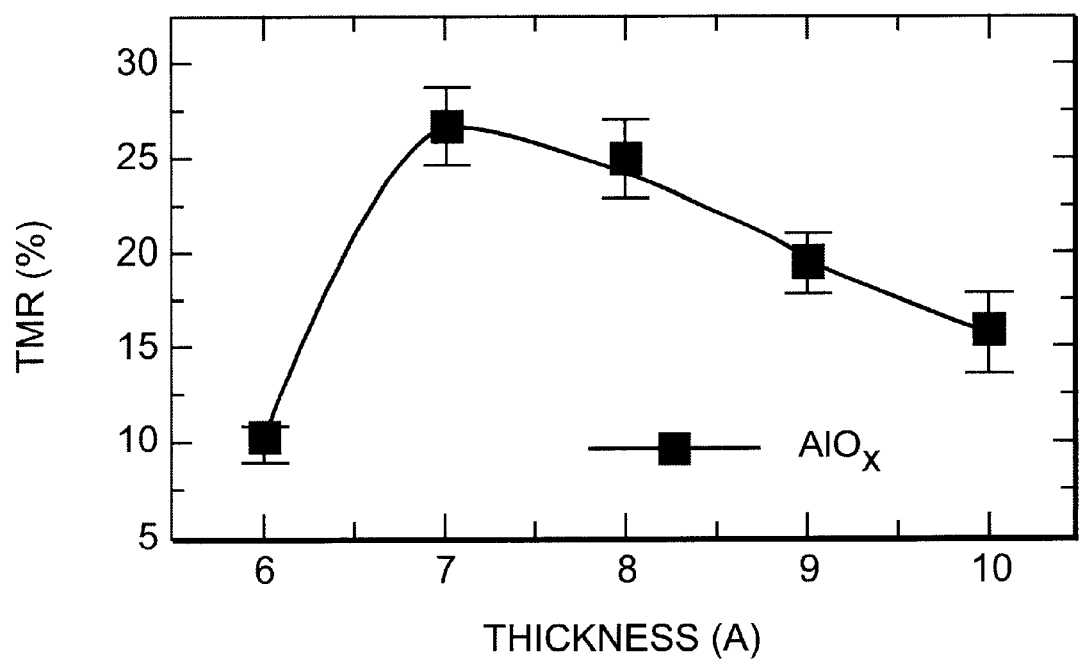
FIGS. 7A–7B illustrate graphical representations of TMR as a function of the thickness of the metallic layer formed of Al and NiCr, respectively, to form the tunnel barrier according to preferred embodiments of the present invention.
Figure 7B:
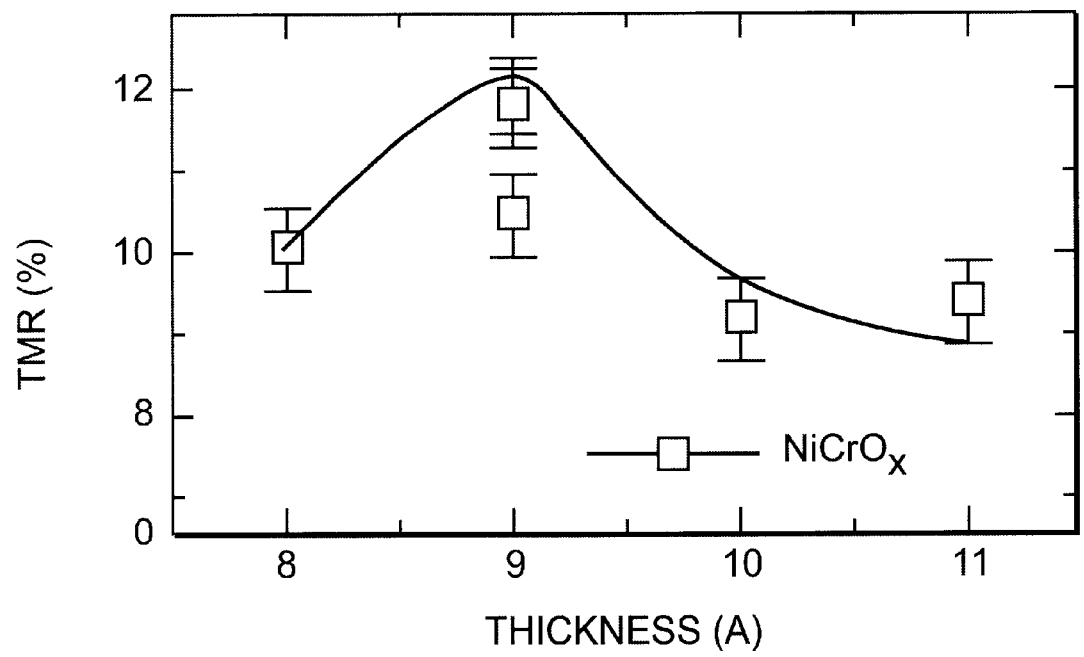

FIGS. 7A–7B illustrate graphical representations of tunneling magnetoresistance (TMR) as a function of the thickness of the metallic layer formed of Al and NiCr, respectively, to form the tunnel barrier according to preferred embodiments of the present invention. As shown in FIG. 7A, for the AlOx tunneling barrier, the maximum TMR was determined to be at the Al thickness of 7 Å. As shown in FIG. 7B, for NiCrOx at same oxidation condition, the maximum TMR was determined to be at the NiCr thickness of 9 Å. This suggests that these two materials have different optimized oxidation conditions. As discussed above, the TMR ratio for the NiCrOx barrier arrangement can be maximized in a number of ways, including ensuring an optimized oxidation condition as well as ensuring an optimized NiCr composition.

The invention has been described with reference to the preferred embodiments. Obviously, modifications and alterations will occur to others upon reading and understanding this specification. It is intended that the invention be construed as including all such modifications and alterations insofar as they come within the scope of the claims or equivalents thereof.

What is claimed is:

1. A magnetic tunnel junction device comprising:
   a first electrode comprising a fixed ferromagnetic layer having a magnetization fixed in a particular direction in the presence of an applied magnetic field; and
   a second electrode comprising a free ferromagnetic layer having a magnetization that is free to rotate in the presence of an applied magnetic field; and
   a tunnel barrier layer, sandwiched between said fixed ferromagnetic layer and said free ferromagnetic layer, for permitting tunneling current to flow in a direction generally perpendicular to the fixed and free ferromagnetic layers, the tunnel barrier layer including an oxidized thin metallic alloy layer of Ni and another non-magnetic material.

2. The magnetic tunnel junction device of claim 1, wherein said another non-magnetic material includes one or more of Cr, Mo, Nb, Zr, and Ga.

3. The magnetic tunnel junction device of claim 1, wherein said another non-magnetic material includes different materials selected from a group consisting of Ga, Al, Ta, Ti, Hf, Mg, Si, Zr, and their alloys.

4. The magnetic tunnel junction device of claim 1, wherein said tunnel barrier layer includes an oxidized thin metallic alloy layer of NiCr and one or more of Nb, Mo, Zr, and Ga.

5. The magnetic tunnel junction device of claim 1, wherein the tunnel barrier layer includes an oxidized thin metallic alloy layer of NiCr.

6. The magnetic tunnel junction device of claim 1, wherein the tunnel barrier layer has a thickness from 1 monolayer to 20 Angstroms.

7. The magnetic tunnel junction device of claim 1, wherein the tunnel barrier layer has a thickness of less than 11 Angstroms.

8. The magnetic tunnel junction device of claim 1, further comprising an antiferromagnetic layer in contact with the fixed ferromagnetic layer of the first electrode for pinning the magnetization of the fixed ferromagnetic layer in its preferred direction.

9. The magnetic tunnel junction device of claim 1, wherein the fixed ferromagnetic layer further comprises a sandwich structure arrangement including two ferromagnetic layers antiferromagnetically coupled together through a non-magnetic metal layer selected from a group comprising Ru, Re, Rh, Cu, and Cr.

10. The magnetic tunnel junction device of claim 1, further comprising a seed layer on which the second electrode is formed, the seed layer being formed of a material selected from a group consisting of Ta, Cr, Ti, NiCr alloys and NiFeCr alloys.

11. The magnetic tunnel junction device of claim 1, wherein said another non-magnetic material includes one or more of Cr, Mo, Ta, Nb, Cu, Pt, Pd, B, C, Al, W, Si, Ti, V, Ru, Re, Zr, and Ga.

12. A method of manufacturing a magnetic tunnel junction device, comprising:
    forming a first electrode comprising a free ferromagnetic layer;
    forming a tunnel barrier layer on said free ferromagnetic layer, the tunnel barrier layer being formed by oxidizing a thin metallic alloy layer of Ni and another non-magnetic material; and
    forming a second electrode comprising a fixed ferromagnetic layer on said tunnel barrier layer.

13. The method of claim 12, wherein said another non-magnetic material used for forming the tunnel barrier layer includes one or more of Cr, Mo, Nb, Zr, and Ga.

14. The method of claim 12, wherein said another non-magnetic material used for forming the tunnel barrier includes different materials selected from a group consisting of Ga, Al, Ta, Ti, Hf, Mg, Si, and their alloys.

15. The method of claim 12, wherein said tunnel barrier layer is formed by oxidizing a thin metallic alloy layer of NiCr and one or more of Nb, Mo, Zr, and Ga.

16. The method of claim 12, wherein said tunnel barrier layer is formed by oxidizing a thin metallic alloy layer of NiCr.

17. The method of claim 12, wherein the formed tunnel barrier layer has a thickness from 1 monolayer to 20 Angstroms.

18. The method of claim 12, wherein the formed tunnel barrier layer has a thickness of less than 11 Angstroms.

19. The method of claim 12, further comprising:
    forming an antiferromagnetic layer on the fixed ferromagnetic layer of the second electrode for pinning the magnetization of the fixed ferromagnetic layer in its preferred direction.

20. The method of claim 12, wherein the fixed ferromagnetic layer is formed in a sandwich structure arrangement by forming two ferromagnetic layers antiferromagnetically coupled together through a non-magnetic metal layer that is formed of a substance selected from a group comprising Ru, Re, Rh, Cu, and Cr.

21. The method of claim 12, further comprising:
    forming a seed layer of a material selected from a group consisting of Ta, Cr, Ti, NiCr alloys and NiFeCr alloys.

22. The method of claim 12, wherein said another non-magnetic material used for forming the tunnel barrier layer includes one or more of Cr, Mo, Ta, Nb, Cu, Pt, Pd, B, C, Al, W, Si, Ti, V, Ru, Re, Zr, and Ga.

23. A magnetic tunnel junction read head arrangement connected to electrical circuitry that detects a change in electrical resistance of the read head in the presence of an applied magnetic field, the read head arrangement comprising:
    a first electrical conducting lead layer; and
    a second electrical conducting lead layer; and
    a magnetic tunnel junction formed between and in contact with the first and second electrical conducting lead layers to form an electrically conductive path from the first lead layer to the second lead layer through the magnetic tunnel junction, the magnetic tunnel junction comprising:
        a first electrode comprising a fixed ferromagnetic layer having a magnetization fixed in a particular direction in the presence of an applied magnetic field;
        a second electrode comprising a free ferromagnetic layer having a magnetization that is free to rotate in the presence of an applied magnetic field; and
        a tunnel barrier layer, sandwiched between said fixed ferromagnetic layer and said free ferromagnetic layer, for permitting tunneling current to flow in a direction generally perpendicular to the fixed and free ferromagnetic layers, the tunnel barrier layer including an oxidized thin metallic alloy layer of Ni and another non-magnetic material.

24. The magnetic tunnel junction read head arrangement of claim 23, wherein said another non-magnetic material includes one or more of Cr, Mo, Nb, Zr, and Ga.

25. The magnetic tunnel junction read head arrangement of claim 23, wherein said another non-magnetic material includes different materials selected from a group consisting of Ga, Al, Ta, Ti, Hf, Mg, Si, and their alloys.

26. The magnetic tunnel junction read head arrangement of claim 23, wherein said tunnel barrier layer includes an oxidized thin metallic alloy layer of NiCr and one or more of Nb, Mo, Zr, and Ga.

27. The magnetic tunnel junction read head arrangement of claim 23, wherein the tunnel barrier layer includes an oxidized thin metallic alloy layer of NiCr.

28. The magnetic tunnel junction read head arrangement of claim 23, wherein the tunnel barrier layer has a thickness from 1 monolayer to 20 Angstroms.

29. The magnetic tunnel junction read head arrangement of claim 23, wherein the tunnel barrier layer has a thickness of less than 11 Angstroms.

30. The magnetic tunnel junction read head arrangement of claim 23, further comprising an antiferromagnetic layer in contact with the fixed ferromagnetic layer of the first electrode for pinning the magnetization of the fixed ferromagnetic layer in its preferred direction.

31. The magnetic tunnel junction read head arrangement of claim 23, wherein the fixed ferromagnetic layer further comprises a sandwich structure arrangement including two ferromagnetic layers antiferromagnetically coupled together through a non-magnetic metal layer selected from a group comprising Ru, Re, Rh, Cu, and Cr.

32. The magnetic tunnel junction read head arrangement of claim 23, further comprising a seed layer on which the second electrode is formed, the seed layer being formed of a material selected from a group consisting of Ta, Cr, Ti, NiCr alloys and NiFeCr alloys.

33. The magnetic tunnel junction read head arrangement of claim 23, wherein said another non-magnetic material includes one or more of Cr, Mo, Ta, Nb, Cu, Pt, Pd, B, C, Al, W, Si, Ti, V, Ru, Re, Zr, and Ga.

* * * * *